United States Patent [19]

Sato

[11] 4,339,672
[45] Jul. 13, 1982

[54] DELAY CIRCUIT CONSTITUTED BY MISFETS

[75] Inventor: Katsuyuki Sato, Kodaira, Japan

[73] Assignee: Hitachi, Ltd., Tokyo, Japan

[21] Appl. No.: 56,854

[22] Filed: Jul. 12, 1979

[30] Foreign Application Priority Data

Jul. 17, 1978 [JP] Japan ................................. 53-86098
Aug. 21, 1978 [JP] Japan ................................ 53-100944

[51] Int. Cl.³ ..................... H03K 3/26; H03K 19/01
[52] U.S. Cl. ................................ 307/270; 307/577;
307/482; 307/594
[58] Field of Search ............. 307/293, 251, 270, 594,
307/482, 577; 331/57

[56] References Cited

U.S. PATENT DOCUMENTS

| | | | |
|---|---|---|---|
| 3,980,896 | 9/1976 | Kato ..................................... | 331/57 |
| 3,986,046 | 10/1976 | Wunner .............................. | 307/293 |
| 4,011,467 | 8/1977 | Shimada et al. .................... | 307/251 |
| 4,071,783 | 1/1978 | Knepper ............................. | 307/251 |
| 4,217,502 | 8/1980 | Suzuki et al. ...................... | 307/251 |

*Primary Examiner*—Stanley D. Miller, Jr.
*Assistant Examiner*—B. P. Davis
*Attorney, Agent, or Firm*—Craig and Antonelli

[57] ABSTRACT

A delay circuit includes first and second MISFETs and a capacitance element connected to the common juncture of the first and the second MISFETs. The electricity of the capacitance element is charged through the first MISFET and is discharged through the second MISFET. Since the first and the second MISFETs effectively perform a push-pull operation, a signal of a predetermined level and a predetermined delay time to be delivered to a circuit having a logic threshold voltage is derived from the common juncture.

2 Claims, 7 Drawing Figures

DELAY CIRCUIT CONSTITUTED BY MISFETS

BACKGROUND OF THE INVENTION

The present invention relates to a delay circuit and, more particularly, to a delay circuit suitable for use on an oscillation circuit such as a ring oscillator.

In a semiconductor integrated circuit constituted by insulated gate type field effect transistors (referred to as MISFET, hereinafter), an oscillation circuit such as a ring oscillator is constituted by a plurality of inverter circuits which are connected in the form of a ring. The delay of a signal in each inverter circuit takes place in the ring oscillator. Since a plurality of inverter circuits are connected in the form of a ring, the delayed signal is fed back through the circuit loop to cause an oscillation.

Each inverter can be constituted by a driving MISFET having a drain and a source connected between an output node and a grounding terminal and a gate connected to an input node, and a load MISFET having a drain and a source connected between a power supply terminal and the output node and a gate connected to the power supply terminal.

The delay time of each inverter circuit is determined by the conductance characteristics of the driving MISFET and load MISFET, and capacitances connected to the output nodes of respective MISFETs.

However, when the inverter circuit as stated above is used, it is necessary to employ a large number of stages of the inverter circuits, in order to obtain the required delay time or, alternatively, it is difficult to obtain the desired signal level with limited stages of inverter circuits.

SUMMARY OF THE INVENTION

It is therefore a major object of the invention to provide a delay circuit capable of ensuring both of the desired delay time and the desired level of signal.

It is another object of the invention to provide a delay circuit suitable for use in an oscillation circuit such as a ring oscillator.

It is still another object of the invention to provide a delay circuit which is suitable for use in a semiconductor integrated circuit.

It is a further object of the invention to provide a delay circuit suitable for use in a substrate biasing voltage generating circuit.

These and other objects, as well as advantageous features of the invention will become clear from the following description of the preferred embodiments taken in conjunction with the accompanying drawings.

DESCRIPTION OF THE PREFERRED EMBODIMENTS

Figure 1:
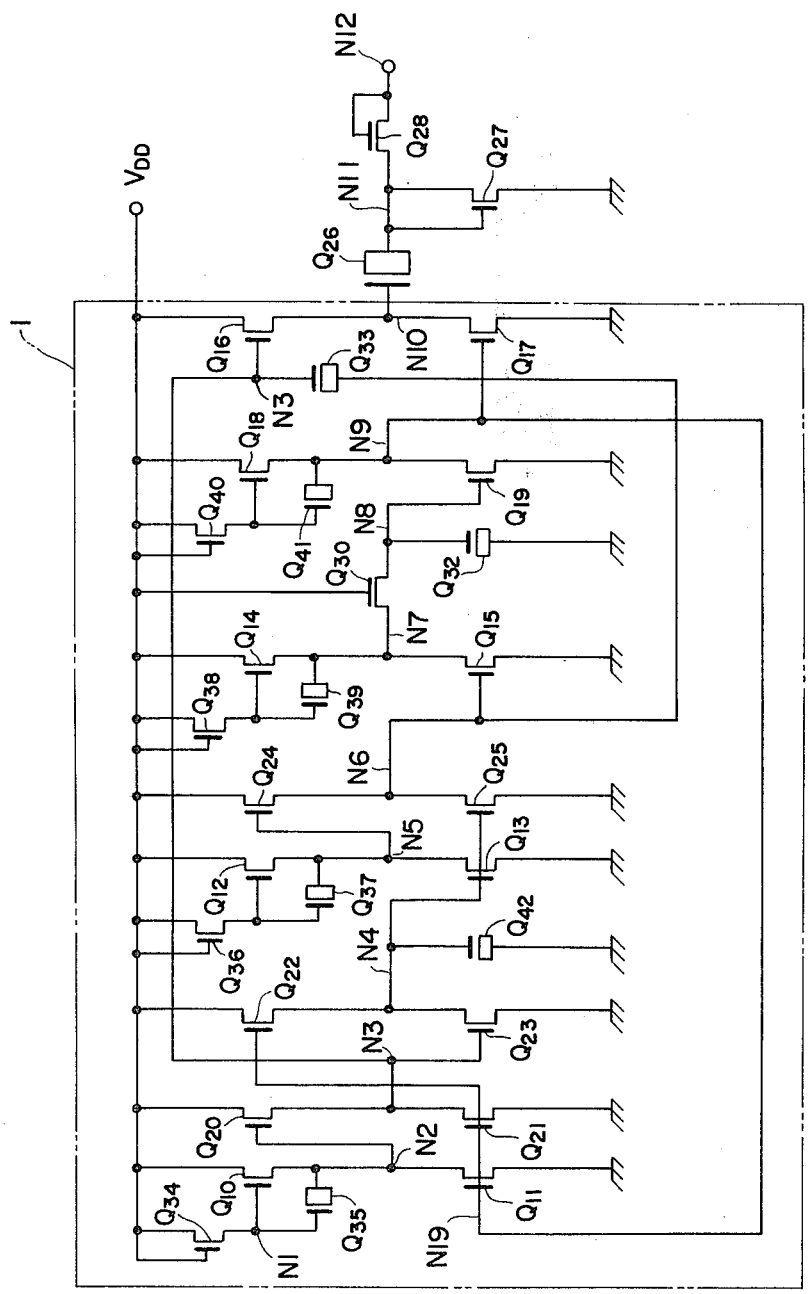
FIG. 1 is a circuit diagram of a ring oscillator and a rectifier circuit incorporating a delay circuit constructed in accordance with an embodiment of the invention.

Referring to the drawings, the portion enclosed by broken-line frame constitutes a ring oscillator, while the circuit outside the broken-line frame constitutes a rectifier circuit.

Although not exclusively limited thereto, the above-stated circuits are generally formed on a common substrate by known semiconductor techniques.

The MISFETs constituting the circuits are of enhancement mode and N channel type. The circuit is adapted to be driven by a power source voltage such as of +5 V delivered to the power supply terminal $V_{DD}$.

In the drawings, an inverter circuit is constituted by a load MISFET Q10, driving MISFET Q11, pull-up MISFET Q34 and a capacitance MISFET Q35.

The driving MISFET Q11 has a drain connected to an output node N2, a source connected to the grounding terminal and a gate connected to the output node N9 of a later-mentioned inverter circuit.

The load MISFET Q10 has a drain connected to the power supply terminal $V_{DD}$, a source connected to the output node N2 and a gate connected to the node N1.

The pull-up MISFET Q34 is connected at its gate and drain to the power supply terminal $V_{DD}$, and, at its source, to the node N1.

The capacitance MISFET Q35 is connected at its gate to the node N1, and at its source and drain, to the output node N2.

In the above-described inverter circuit, the pull-up MISFET Q34 and a capacitance MISFET Q35 in combination constitute a bootstrap circuit.

In this bootstrap circuit, the pull-up MISFET Q34 is connected at its gate and drain to the power supply terminal $V_{DD}$ and, at its source, to the node N1. Therefore, the MISFET Q34 is turned on when the potential at the node N1 is lowered to a level which is lower than the potential at the power supply terminal $V_{DD}$ by a voltage corresponding to its threshold voltage. Namely, the pull-up MISFET Q34 limits the low voltage level at the node N1 to a level $V_{DD}$-Vth, where $V_{DD}$ is the potential at the power supply terminal $V_{DD}$ and Vth represets the threshold voltage of the MISFET Q34.

To the contrary, the pull-up MISFET Q34 is turned off as the voltage at the node N1 has become higher than the voltage $V_{DD}$-Vth. Namely, the pull-up MISFET Q34 does not limit the high voltage level at the node N1.

As the driving MISFET Q11 is turned on by the high level of the signal at the node N9, the voltage at the node N2 is lowered to a level substantially equal to that of the ground potential. In this state, the capacitance between the gate/source of the capacitance MISFET Q34 and the drain of the same is charged substantially to the level of $V_{DD}$-Vth, because the voltage at the node N1 is changed substantially to $V_{DD}$-Vth.

As the driving MISFET Q11 is turned off due to the low level of the signal at the node N9, the voltage at node N1 is raised in accordance with the rise of the potential at the node N2, so that the pull-up MISFET Q34 is turned off. As a result, the charging voltage of the capacitance MISFET Q35 is maintained substantially constant.

Since the voltage between the nodes N1 and N2 is maintained constant by the capacitance MISFET Q35, the potential at the node N1 is increased in accordance with the rise of the potential at the node N2 and comes to exceed the power source voltage.

Since the voltage at the node N1 comes up to a level which is higher than the power source voltage by the threshold voltage of the load MISFET Q10, the load MISFET Q10 is kept in an on state even after the voltage at the output node N2 has been raised substantially to the level of the power source voltage. In consequence, a high level signal which can rise substantially to the level of the power source voltage without suffering the voltage drop due to the threshold voltage of the load MISFET Q10 is available at the output node N2.

The inverter circuit as stated above having a load MISFET having a gate receiving the voltage derived from a bootstrap circuit will be referred to as bootstrap pull-up inverter circuit (B.P. inverter circuit), hereinafter.

Another inverter circuit is constituted by MISFETs Q20 and Q21. The MISFET Q20 is connected at its drain to the power supply terminal $V_{DD}$, while the source thereof is connected to the output node N3. The gate of this MISFET Q20 is connected to the output node N2 of the first B.P inverter constituted by the MISFETs Q10, Q11, Q34 and Q35.

The MISFET Q21 is connected at its drain to an output node N3, while the source thereof is connected to the grounding terminal. Also the gate of this MISFET is connected to a node N9.

The low level of the signal at the output node N2 of the B.P inverter of the first stage is determined by the ratio of conductances which substantially corresponds to the ratio of the size of the load MISFET Q10 to that of the driving MISFET Q11. In contrast to the above, the low level of the signal at the output node N3 is maintained substantially at the ground potential irrespective of the ratio of conductances of the MISFETs Q20 and Q21, because these MISFETs perform a push-pull operation.

Therefore, the inverter circuit constituted by the above MISFETs Q20 and Q21 will be referred to as ratio-less inverter circuit.

A second ratio-less inverter circuit is constituted by MISFETs Q22 and Q23. The signal derived from the node N9 is delivered to the gate of the MISFET Q22 connected between the power supply terminal $V_{DD}$ and the output node N4, whereas the MISFET Q23 connected between the output node N4 and the grounding terminal receives the signal from the output node N3.

As illustrated, a capacitance MISFET Q42 is connected between the output node N4 of the second ratio-less inverter and the grounding terminal.

A second B.P inverter is constituted by MISFETs Q12, Q13, Q36 and capacitance MISFET Q37. Also, a third ratioless inverter is constituted by MISFETs Q24 and Q25.

At the gate of the MISFET Q13 of the second B.P inverter, delivered is the signal derived from the output node N4, while the gate of the MISFET Q25 of the third ratio-less inverter receives a signal coming from the output node N4 of the second ratio-less inverter circuit. Also, the gate of the MISFET Q24 receives the signal derived from the output node N5 of the second B.P inverter.

A third B.P inverter is constituted by MISFETs Q14, Q15, Q38 and a capacitance MISFET Q39. The signal derived from the output node N6 of the third ratio-less inverter is supplied to the gate of MISFET Q15 of the third B.P inverter.

A delay circuit constituted by a MISFET Q30 which materially acts as a resistance element and a capacitance MISFET Q32 is connected to the output node N7 of the above-stated third B.P inverter.

A fourth B.P inverter is constituted by MISFETs Q18, Q19, Q40 and a capacitance MISFET Q41. A signal derived from the output node N8 of the above-mentioned delay circuit is connected to the gate of MISFET Q19 of the fourth B.P inverter. A fourth ratio-less inverter is constituted by MISFETs Q16, Q17 and capacitance MISFET Q33.

To the gate of the MISFET Q17 of the fourth ratio-less inverter, is delivered the signal derived from the node N8 of the aforementioned delay circuit, while the gate of the MISFET Q16 receives the signal derived from the output node N3 of the first ratio-less inverter. The commonly connected source and drain of the capacitance MISFET Q33 receives the signal coming from the output node N6 of the third ratio-less inverter.

The signal available at the output node N9 of the fourth B.P inverter is also delivered to the first B.P inverter, and to the first and second ratio-less inverters.

The signal at the output node of each B.P inverter and ratio-less inverter is delayed in accordance with various capacitances connected to the output node, e.g. the source coupling capacitance of the MISFET connected to the output node, drain coupling capacitance, wiring capacitance, capacitance of the capacitance MISFET and so forth.

Since the signal delayed by successive inverters is fed back, the circuit as a whole oscillates. The oscillation output of the ring counter as shown in FIG. 1 is derived from the output node N10 of the fourth ratio-less inverter. Although not exclusively limited thereto, the oscillation output from the ring counter is delivered to the rectifier circuit which is constituted, as shown in the drawings, by a capacitance MISFET Q26 and MISFETs Q27 and Q28 of a diode connection.

The above-mentioned rectifier circuit delivers a negative bias voltage to an output node N12, as it receives the oscillation output from the ring counter, the oscillation output level changing cyclically between 0 volt and a voltage substantially equal to the power source voltage.

The negative bias voltage of the output node N12 is delivered to a semiconductor substrate (not shown) on which MISFETs for other circuit such as dynamic logical circuit are formed together with the ring counter and the rectifier circuit. As the negative bias voltage is delivered to the substrate on which N source region and drain region are formed, leak currents in various MISFETs are remarkably reduced.

Figure 2:
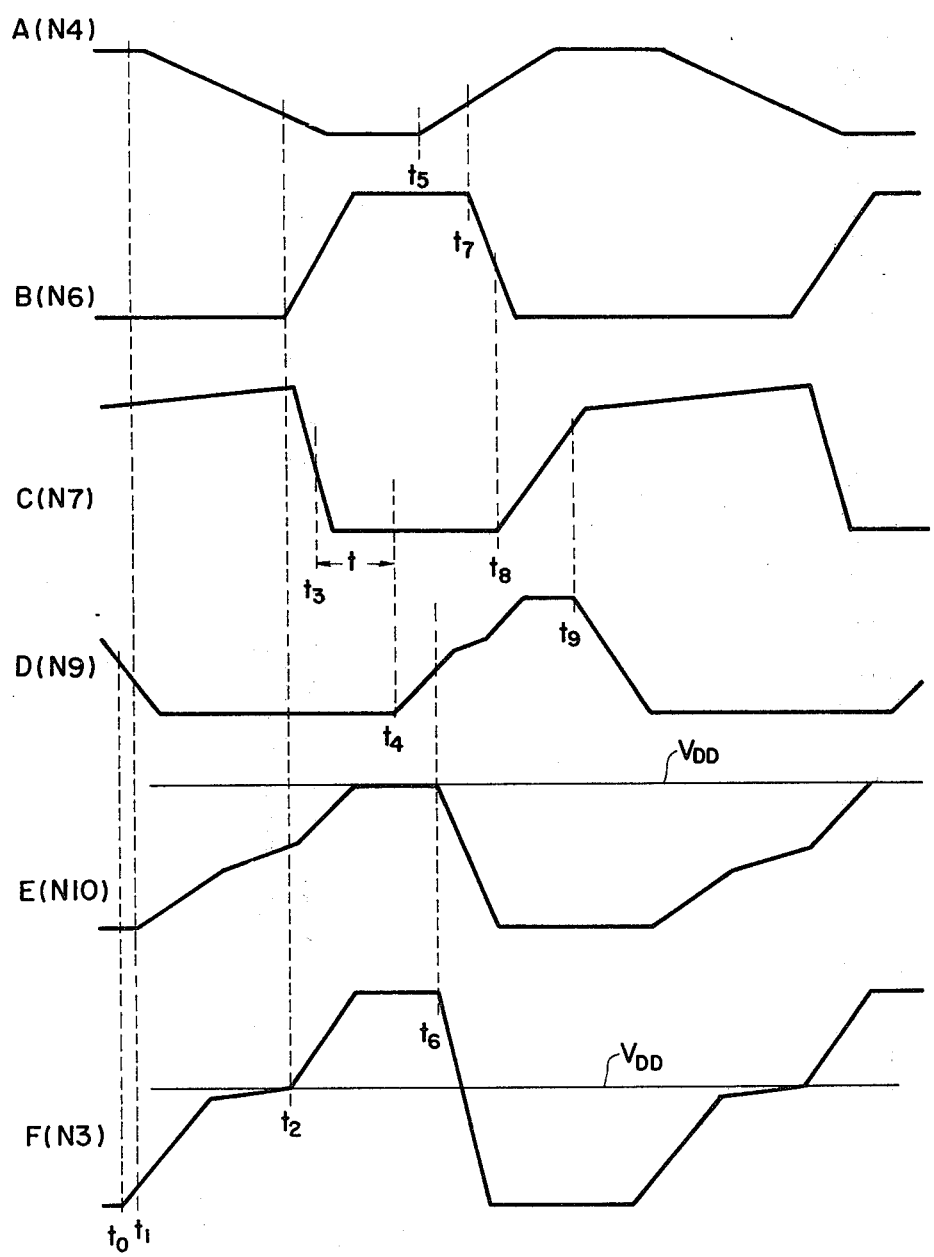
FIG. 2 shows wave forms as observed during operation of the circuits as shown in FIG. 1.

The operation of the ring oscillator having the described construction will be described hereinunder with reference to wave-form chart shown in FIG. 2.

As will be understood from an explanation which will be given later, the signal at the node N9 of the fourth B.P inverter is changed in accordance with the characteristic shown in FIG. 2D.

As the voltage at the output node N9 is lowered and comes down below the level of the threshold voltage of the first ratio-less inverter at a moment when the voltage at the output node N3 of the first ratio-less inverter starts to rise from the level substantially equal to the ground potential, as shown in FIG. 2F.

At this time, the voltage at the output node N6 of the third ratioless inverter is kept substantially at the level of the ground potential, as shown in FIG. 2B. As a result, the capacitance MISFET Q33 starts to be charged in accordance with the rise of the voltage at the output node N3 of the first ratio-less inverter.

As the output voltage at the output node N2 rises substantially to the level of the power source voltage, the MISFET Q20 of the first ratio-less inverter is sufficiently turned on. In consequence, the voltage of the output node N3 reaches substantially the level of $V_{DD}$-Vth.

Meanwhile, the MISFET Q23 of the second ratio-less inverter is turned on due to the rise of the potential at the output node N3. On the other hand, the MISFET Q22 is turned off, because the potential at the output node N9 is lowered substantially to the level of the ground potential.

Therefore, the electricity which has been charged in the MISFET Q22 is discharged through the MISFET Q23 which is now in the on state. In consequence, the voltage of the output node N4 begins to decrease as shown in FIG. 2A.

As the voltage at the output node N4 comes down below the level of the threshold voltage of the second B.P inverter at a moment t2, the voltage at the node N5 of the second B.P inverter starts to rise. Consequently, the voltage at the output node N6 of the third ratio-less inverter begins to rise substantially from the level of the ground potential, as shown in FIG. 2B.

As the voltage at the output node N6 starts to rise substantially at the moment t2, the voltage at the output node N3 starts to rise again from the level of $V_{DD}$-Vth as shown in FIG. 2F, due to the capacitance coupling by the capacitance MISFET Q33.

At this time, as the voltage at the node N3 comes to exceed the level of the $V_{DD}$-Vth, the MISFET Q20 in the first ratio-less inverter is turned off, because the source of the latter begins to act materially as the drain.

Therefore, the electricity with which the capacitance MISFET Q33 is charged is not discharged through the MISFET Q20. The MISFET Q16 of the fourth ratio-less inverter is turned on in good condition by the voltage at the output node N3.

In consequence, the voltage at the output node N10 of the fourth ratio-less inverter takes the high level which rises, as shown in FIG. 2E, substantially to the level of the power source voltage.

As the output from the third ratio-less inverter starts to rise at the moment t2, the third B.P inverter which receives this output produces at the output node N7 a voltage which starts to fall at a certain delay to the moment t2 as shown in FIG. 2C.

As a result of the commencement of the fall of the voltage at the output node N7, the capacitance MISFET Q32 which has been beforehand charged through the MISFET Q14 and the resistance MISFET Q30 starts to discharge.

At a moment t4 which lags behind the moment at which the voltage at the node N7 starts to fall by a predetermined time length t, the charging voltage of the capacitance MISFET Q32 comes down below the level of the logical threshold voltage of the fourth B.P inverter. In consequence, the voltage of the output node N9 of the fourth B.P inverter starts to rise as shown in FIG. 2D.

At a moment t6, the voltage at the output node N9 comes to exceed the level of the threshold voltage of the MISFET Q17 of the fourth ratio-less inverter. In consequence, the voltage of the output node N10 of the fourth ratio-less inverter starts to fall as shown in FIG. 2E.

On the other hand, the voltage of the output node N9 turns on the MISFET Q22 of the second ratio-less inverter, at a moment t5 which lags by a certain time behind the moment t4. In consequence, the capacitance MISFET Q42, which has been kept by the MISFET Q23, starts to be charged through the MISFET Q22, so that the voltage at the output node N4 starts to rise as shown in FIG. 2A.

As the logical threshold voltage of the second inverter is exceeded by the voltage of the above-stated output node N4 at a moment t7, the voltage at the output node N6 of the third ratio-less inverter starts to fall in accordance with the output from this second B.P inverter.

The voltage at this output node comes down below the level of the third B.P inverter at a moment t8, so that the voltage at the output node N7 of the third B.P inverter starts to rise at this moment, as shown in FIG. 2C.

At a moment t9 which lags behind the moment t8 by a predetermined delay time which is determined by the resistance MISFET Q30 and the capacitance MISFET Q32, the voltage at the output anode N8 comes to exceed the level of the logical threshold voltage of the fourth B.P inverter. In consequence, the voltage at the output node N9 fourth B.P inverter starts to fall again, as shown in FIG. 2D.

Therefore, after the moment t9, the circuit resumes the starting condition as at the moment t0.

In the second ratio-less inverter, the MISFETs Q22 and Q23 are made to effectively perform a push-pull operation. Namely, while one of the MISFETs Q22 and Q23 is in an on state, the other is kept in an off state.

As a result of the above-described operation, when the voltage at the output node N4 is lowered due to the on-state of the MISFET Q23, the MISFET Q22 does not limit the lowering of the voltage at the output node N4. In consequence, the high level of the voltage at the output node 4 is raised up substantially to the level of $V_{DD}$-Vth, irrespective of the relative size of the MISFETs Q22 and Q23, so that the low level is decreased substantially to the level of the ground voltage.

Due to the substantial push-pull function of the MISFETs Q22 and Q23, the charging characteristic of the capacitance MISFET Q42 is determined in accordance with the conductance characteristic of the MISFET Q22. In contrast to the above, the discharging characteristic of the capacitance MISFET Q42 is determined in accordance with the conductance characteristic of the MISFET Q23.

This means that the rising characteristic and falling characteristic of the voltage at the output node N4 can be determined as desired independently of each other.

In consequence, the ring oscillator as shown in FIG. 1 can have any desired duty ratio of the oscillation output.

Figure 7:
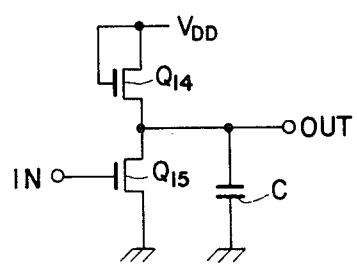
FIG. 7 is a circuit diagram of an inverter.

A circuit such as the first B.P inverter circuit or a ratio inverter as shown in FIG. 7 may be used in place of the third ratio-less inverter. In this case, however, attention must be paid to the fact that the low level of the voltage at the output node N4 inevitably rises in accordance with the ratio of conductance of the driving MISFET to the conductance of the load MISFET. Namely, in order to safely drive the second B.P inverter by the voltage of the output node N4, it is necessary to make the conductance of the driving MISFET for the discharging sufficiently smaller than that of the conductance of the load MISFET. Therefore, it becomes difficult to determine the rising and falling characteristics at the node N4 optionally and independently of each other.

Figure 3:
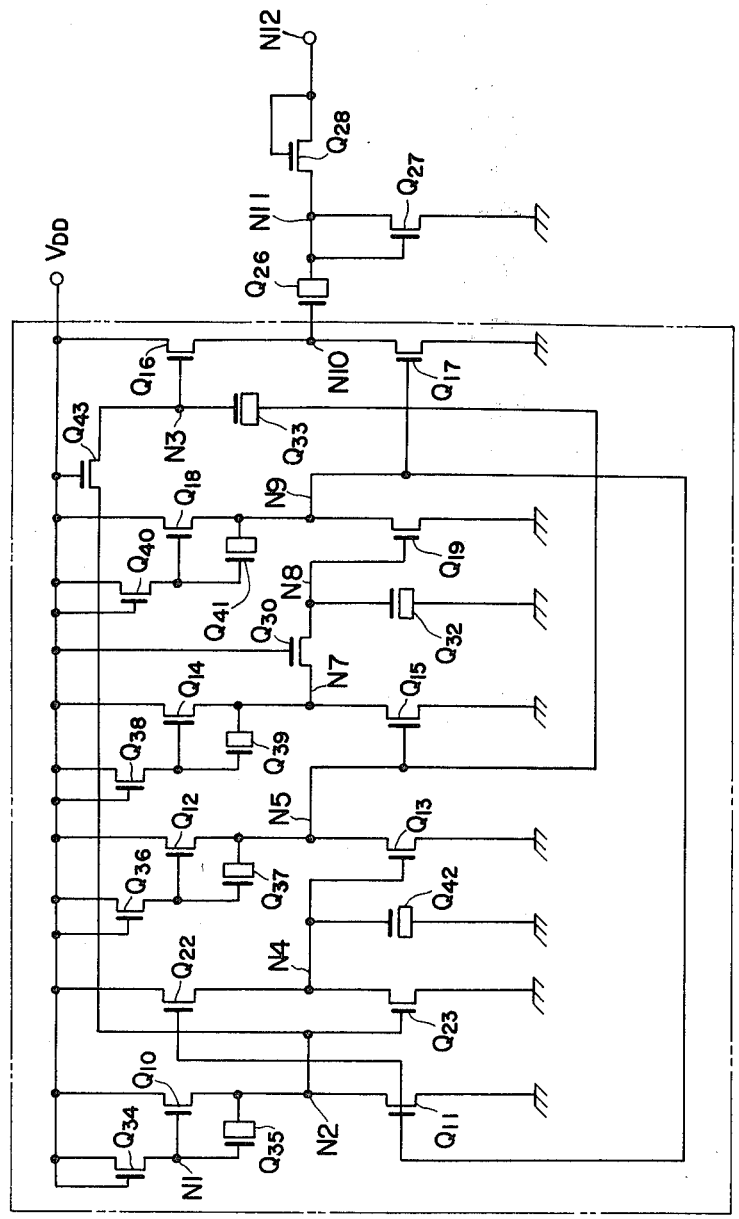
FIGS. 3 to 6 show different examples incorporating the delay circuit of the invention.

FIG. 3 shows a circuit diagram of another example of the present invention. This circuit corresponds to the circuit shown in FIG. 1 from which the first ratio-less inverter constituted by MISFETs Q20 and Q21 and the third ratio-less inverter constituted by MISFETs Q24 and Q25 have been omitted.

Therefore, the voltage at the output node N2 of the first B.P inverter constituted by the MISFETs Q10, Q11, Q34 and the capacitance MISFET Q35 is delivered to the gate of the MISFET Q23 constituting the first ratio-less inverter and also to the drain of the MISFET Q43.

Also, the voltage at the node N5 of the second B.P inverter constituted by the MISFETs Q12, Q13, Q36 and the capacitance MISFET Q37 is delivered to the commonly connected source and drain of the MISFET Q15 and the capacitance MISFET Q33.

In the first B.P inverter, the load MISFET Q10 receives at its gate a voltage which can rise to a level higher than the power source voltage, so that it can be turned on even when the potential at the output node N2 has been raised above the level of the power source voltage. The MISFET Q43 is turned off when the voltage at the node N3 to which the capacitance MISFET Q33 is connected is raised above the power source voltage in accordance with the output voltage of the second B.P inverter. Namely, the MISFET Q43 is used for preventing the electricity from being undesirably discharged from the capacitance MISFET Q33 through the first B.P inverter.

The ratio-less inverter constituted by the MISFETs Q22 and Q23 operates in the same manner as the second ratio-less inverter shown in FIG. 1.

Figure 4:
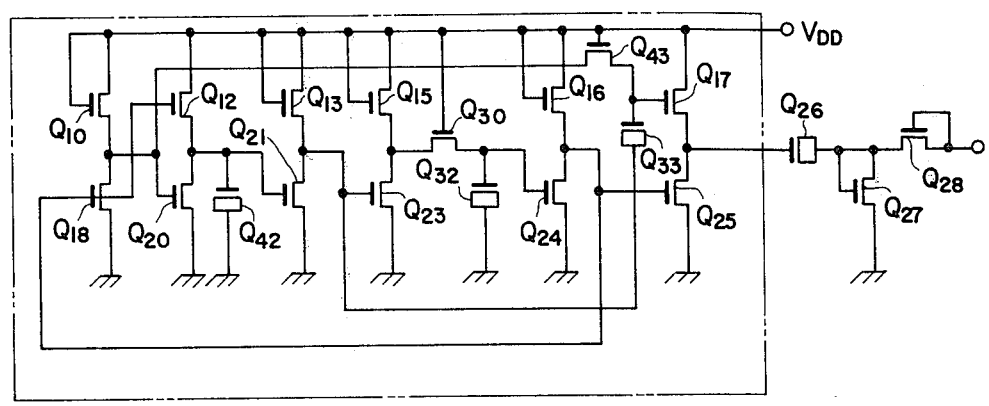

FIG. 4 shows a circuit diagram of another example. In this circuit, each B.P inverter of the embodiment shown in FIG. 3 have been substituted by the inverter as shown in FIG. 7.

The delay circuit of the invention constituted by MISFETs can be applied not only to the circuits as shown in FIGS. 1, 3 and 4 in which all of the MISFETs employed are of enhancement mode but also to circuits in which MISFETs of enhancement mode (referred to as E type MISFET) and depression mode MISFETs (referred to as D type MISFET) are combined with each other.

Figure 5:
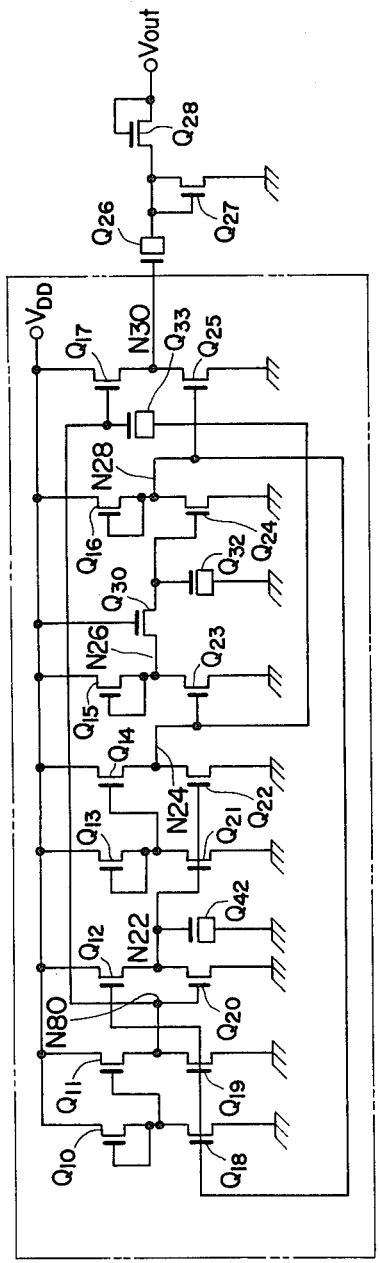

FIG. 5 shows still another embodiment employing both of E type and D type MISFETs. In this Figure, the portion enclosed by broken lines constitutes a ring oscillator.

In this ring oscillator, a first ratio inverter is constituted by an E type MISFET Q18 and a D type MISFET Q10 in which the gate and source are short-circuitted, while a first ratio-less inverter is constituted by E type MISFETs Q11 and Q19. Further, a second ratioless inverter is formed by E type MISFETs Q12 and Q20.

An E type MISFET Q21 and a D type MISFET Q13 having a short-circuitted gate and source in combination constitute a second ratio inverter, while a third ratio-less inverter is constituted by E type MISFETs Q14 and Q22.

An E type MISFET Q23 and a D type MISFET Q15 having a short-circuitted gate and source in combination constitute a third ratio inverter.

An E type MISFET Q30 which acts as a resistance element and an E type MISFET Q32 in combination constitute a delay circuit.

A fourth ratio inverter is constituted by an E type MISFET Q24 and a D type MISFET Q16 having a short-circuitted gate and source.

Finally, a fourth ratio-less inverter is constituted by E type MISFETs Q17 and Q25 and by an E type MISFET Q33 which functions as a capacitance element.

These inverters are connected in the same manner as in the ring oscillator shown in FIG. 1.

The circuit shown in FIG. 5 and having the described construction oscillates in the same manner as the circuit shown in FIG. 1.

The oscillation output is derived from the output node of the fourth ratio-less inverter. This oscillation output is delivered to a rectifier circuit which is constituted by capacitance E type MISFET Q26, as well as by E type MISFETs Q26 and Q28 of diode connection.

The inverter making use of a D type MISFET as the load means can output a high level voltage substantially equal to the power source voltage and a low level voltage which is substantially equal to the low level voltage. Therefore, it is possible to substitute a D type MISFET for the E type MISFET of the fourth inverter, and to remove the capacitance MISFET Q33, so as to obtain oscillation output in which high level signal of a level substantially equal to the level of the power source voltage and a low level signal substantially of the same level as the ground potential are alternatingly and repeatedly issued. The D type MISFET, however, takes the on state even when its gate is kept at zero volt. Therefore, if the D type MISFET is used as the MISFET Q17 as stated above, a through current flows through the MISFETs Q17 and Q25, when the MISFET Q25 is turned on. In order to supply a sufficiently large oscillation power to a comparatively heavy load, the MISFETs Q17 and Q25 of the fourth ratio-less inverter may have comparatively large sizes. By doing so, however, a through current flowing through the MISFETs Q17 and Q25 is rendered much larger than the through currents flowing through other inverters.

In the embodiment shown in FIG. 5, the undesirable generation of the through current is prevented by the use of an E type MISFET as the MISFET Q17.

Figure 6:
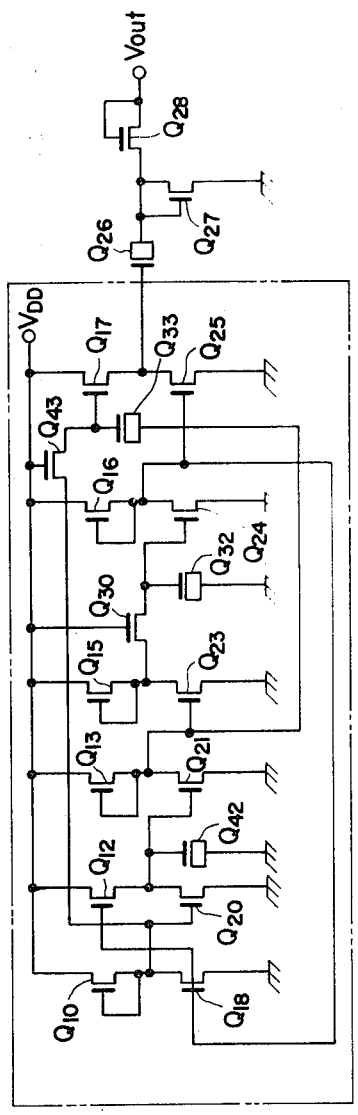

FIG. 6 shows the circuit of still another embodiment. This circuit corresponds to the circuit shown in FIG. 5 from which are omitted the first ratio-less inverter constituted by the MISFETs Q11 and Q19 and the third ratio-less inverter constituted by the MISFETs Q14 and Q22. Since the first ratio-less inverter is eliminated, a switching E type MISFET Q43 is additionally used, for the reason explained before in connection with the embodiment shown in FIG. 3.

What is claimed is:

1. A driving circuit, for driving a push-pull inverter having first and second insulated gate type field effect transistors connected in series between first and second power supply terminals, said driving circuit comprising:
   a first delay circuit including:
      a third insulated gate type field effect transistor having a drain connected to said first power supply terminal, a source connected to an output node and a gate connected to an input node;
      a fourth insulated gate type field effect transistor having a drain connected to said output node, a source connected to said second power supply terminal and a gate;
   a capacitance element connected between said output node and said second power supply terminal; and
   a first inverter having an input terminal connected to said input node and an output terminal connected to said gate of said first insulated gate type field effect transistor and to said gate of said fourth insulated gate type field effect transistor;

a second inverter having an input terminal connected to said output node; and a bootstrap capacitor having first and second terminals, wherein said first terminal is connected to a gate of said first insulated gate type field effect transistor, and said second terminal is connected to an output terminal of said second inverter, and said gate of said second insulated gate type field effect transistor is connected to said input node.

2. A driving circuit as claimed in claim 1, wherein an output signal at said output node is delivered to said input terminal of said first inverter through a second delay circuit.

* * * * *